United States Patent [19]

Nakano et al.

[11] Patent Number: 5,017,810
[45] Date of Patent: May 21, 1991

[54] INPUT SWITCHING DEVICE USED IN A LOGIC MOS INTEGRATED CIRCUIT

[75] Inventors: Yuji Nakano, Kawasaki; Koji Saitoh, Yokohama; Hiroaki Murakami, Higashimine, all of Japan

[73] Assignee: Kabushiki Kaisha Toshiba, Kawasaki, Japan

[21] Appl. No.: 486,766

[22] Filed: Mar. 1, 1990

[30] Foreign Application Priority Data

Mar. 3, 1989 [JP] Japan ................................ 1-51710

[51] Int. Cl.$^5$ .......................................... H03K 19/177
[52] U.S. Cl. ..................................... 307/465; 307/468
[58] Field of Search ................. 307/465, 243, 468-469, 307/272.2; 364/716; 365/189.03

[56] References Cited

U.S. PATENT DOCUMENTS

| | | | |
|---|---|---|---|
| 4,758,746 | 7/1988 | Birkner et al. | 307/465 |
| 4,763,020 | 8/1988 | Takata et al. | 307/465 |
| 4,789,951 | 12/1988 | Birkner et al. | 364/716 |
| 4,835,414 | 5/1989 | Freidin | 307/243 |
| 4,857,775 | 8/1989 | Obata et al. | 307/465 X |
| 4,879,481 | 11/1989 | Pathak et al. | 307/468 X |
| 4,933,577 | 6/1990 | Wong et al. | 307/243 X |
| 4,970,410 | 11/1990 | Matsushita et al. | 307/465 X |

OTHER PUBLICATIONS

Signetics PLD data manual, chapter 3, PLC 16v8 Series Erasable and OTP PAL-type Device, Jun. 22, 1988.

Primary Examiner—David Hudspeth
Attorney, Agent, or Firm—Finnegan, Henderson, Farabow, Garrett and Dunner

[57] ABSTRACT

A first input signal is supplied to a register and stored therein. The first input signal and data stored in the register are supplied to a first logic circuit. The first logic circuit is controlled by an output signal of a flag circuit and selects one of the first input signal and the data stored in the register. A second input signal is supplied to a second logic circuit. The second logic circuit is controlled by an output signal of the flag circuit and selects one of supplying the second input signal to the register as a clock signal and supplying the second input signal to a peripheral circuit as an input signal. The flag circuit supplies the second input signal to the register as the clock signal when the first logic circuit selects the output signal of the register, and supplies the second input signal to the peripheral circuit as the input signal when the first logic circuit selects the first input signal.

14 Claims, 4 Drawing Sheets

INPUT SWITCHING DEVICE USED IN A LOGIC MOS INTEGRATED CIRCUIT

BACKGROUND OF THE INVENTION

1. Field of the Invention

The present invention relates to an input switching device used in a logic MOS integrated circuit.

2. Description of the Related Art

A conventional input switching device comprises a register, a first and second logic circuits, and a first and second flag circuits. The register receives an arbitrary input signal and then stores it. The first logic circuit is supplied with the input signal and data stored in the register. The first logic circuit is controlled in accordance with the condition of a flag of the first flag circuit and outputs one of the input signal and the data stored in the register. The second logic circuit is supplied with an input signal from an input pad of an integrated circuit. The second logic circuit supplies the input signal from the input pad to a clock input terminal of the register in accordance with the condition of a flag of the second flag circuit to thereby control the operation of the register or supplies the input signal from the input pad to peripheral circuit as an input signal. In other words, the input signal supplied from the input pad is selectively used as a clock signal for controlling the operation of the register and an input signal of the peripheral circuit. This circuit arrangement aims at reducing the number of IC pads by using the input pad for both inputting clock signals and inputting signals to the peripheral circuit.

The first logic circuit comprises a first and second AND gates and a OR gate. The above-described arbitrary input signal is supplied to one input terminal of the first AND gate, and an output signal of the register is supplied to one input terminal of the second AND gate. An inverted signal of an output signal of the first flag circuit is supplied to the other input terminal of the first AND gate, and an output signal of the first flag circuit is supplied to the other input terminal of the second AND gate. Output signals of the first and second AND gates are supplied to an OR gate, and the arbitrary input signal or the data stored in the register is output from an output terminal of the OR gate in accordance with the flag of the first flag circuit.

The second logic circuit comprises a third and fourth AND gates. An output signal of the second flag circuit is supplied to one input terminal of the third AND gate and its inverted signal is supplied to the other input terminal of the fourth AND gate. Input signals are supplied from the input pads to the other input terminals of the third and fourth AND gates. An output signal of the third AND gate is supplied to the clock input terminal of the register, and an output signal of the fourth AND gate is supplied to the peripheral circuit as an input signal.

With the above circuit arrangement, however, when the flag of the first flag circuit is set in the condition that the first logic circuit selects and outputs the data stored in the register, if the flag of the second flag circuit is set in the condition that the second logic circuit supplies an input signal to the peripheral circuit, any clock signal is not supplied to the register and thus a malfunction may occur. In order to select the data stored in the register and output it therefrom, a clock signal needs to be supplied to the register and, in other words, the register needs to be in an operating state. If the flag of the second flag circuit is set in the condition that an input signal from the input pad is supplied as an input signal of the peripheral circuit, the register is not operated since it does not receive any clock signal for control. It cannot be therefore thought that the data stored in the register is normally supplied to the first logic circuit and output therefrom. This attributes to the fact that the flags of the first and second flag circuits are set separately.

When the flag of the first flag circuit is set in the condition that the first logic circuit selects the arbitrary input signal, if the flag of the second flag circuit is set in the condition that the second logic circuit outputs an input signal as clock signal of the register, no problems occur in the circuit operation. However, since a clock signal is always input to an unused register, power consumption is wasted.

Since the flags of both the first and second flag circuits need to be set, the flag setting operation is complicated and a pattern for two flag circuits is needed within the IC, resulting in an increase in the are of the pattern.

SUMMARY OF THE INVENTION

It is accordingly an object of the present invention to provide an input switching device which can be reliably operated.

Another object of this invention is to provide an input switching device capable of preventing high power consumption.

Still another object of this invention is to provide an input switching device which can be operated by a single flag circuit and which can simplify a flag setting operation and reduce the area of a pattern.

The above objects can be attained by an input switching device comprising; a logic circuit whose operation is controlled by a control signal, for performing logical processing in response to a first input signal; a first selector circuit for receiving the first input signal and an output signal of the logic circuit, and selecting and outputting one of the first input signal and the output signal; a second selector circuit for selecting one of supplying a second input signal to the logic circuit as a control signal and supplying the second input signal to a peripheral circuit as an input signal; and a control circuit for controlling selecting operations of the first and second selector circuits to supply the second input signal to the logic circuit as a control signal when the first selector circuit selects the output signal of the logic circuit and to supply the second input signal to the peripheral circuit as an input signal when the first selector circuit selects the first input signal.

With the above arrangement, two selector circuits are controlled by one flag circuit (control circuit) and the selecting operation of the first selector circuit is associated with that of the second selector circuit. When the first selector circuit selects and outputs data stored in the register, the second selector circuit supplies the second input signal to the register (logic circuit) as a clock signal and thus the register goes into an operation state. Consequently, any malfunction does not occur and a reliable operation can be expected.

When the first selector circuit selects and outputs the first input signal, the second selector circuit outputs the second input signal as an input signal of the peripheral circuit. Since the register is not supplied with a clock signal for control, it is not operated. Low power consumption can be achieved without wasting power consumption.

Furthermore, since the number of flag circuits is one, the flag setting operation can be simplified and the area of a pattern can be decreased.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
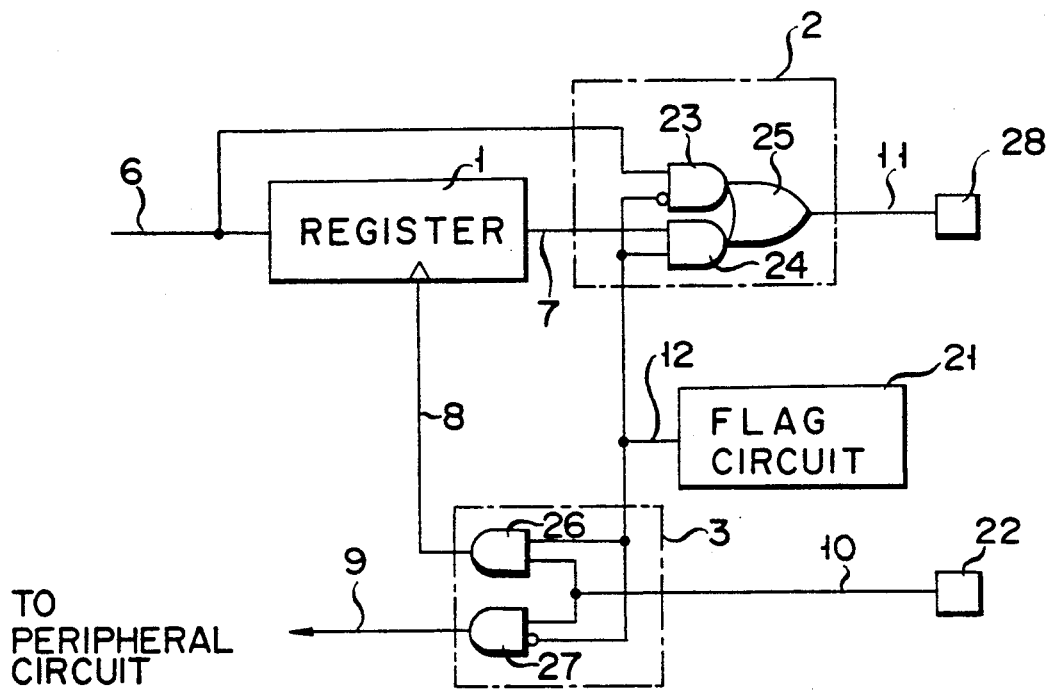
FIG. 1 is a block diagram showing an input switching device according to a first embodiment of the present invention.

FIG. 1 shows an input switching device according to a first embodiment of the present invention. The input switching device comprises register 1 (logic means), first and second logic circuits (first and second selector means) 2 and 3, and flag circuit (control means) 21. Register 1 is supplied with arbitrary input signal (first input signal) 6. Logic circuit 2 is supplied with input signal 6 and data 7 stored in register 1. Logic circuit 2 comprises AND gates 23 and 24 and OR gate 25. Input siganl 6 is supplied to one of input terminals of AND gate 23 and data 7 stored in register 7 is supplied to one of input terminals of AND gate 24. Output signal 12 of flag circuit 21 is inverted and supplied to the other input terminal of AND gate 23, and output signal 12 of flag circuit 21 is supplied to the other input terminal of AND gate 24. Output signals of AND gates 23 and 24 are supplied to OR gate 25, and output signal 11 is output from an output terminal of OR gate 25 via output pad 28. Logic circuit 2 is controlled in accordance with the condition of the flag set in flag circuit 21, selects one of input signal 6 and stored data 7, and outputs a selected one as output signal 11. Logic circuit 3 is supplied with input signal 10 (second input signal) supplied from input pad 22 of an IC. Logic circuit 3 comprises AND gates 26 and 27. Output signal 12 of flag circuit 21 is supplied to one of input terminals of AND gate 26, and an inverted signal of signal 12 is supplied to one of input terminals of AND gate 27. Input signal 10 is supplied to the other input terminals of AND gates 26 and 27. Output signal 8 of AND gate 26 is supplied to a clock input terminal of register 1, and output signal 9 of AND gate 27 is supplied to a peripheral circuit as an input signal. Logic circuit 3 suplies input signal 10 to the clock input terminal of register 1 as clock signal 8 in accordance with the setting state of the flag of flag circuit 21, and controls the operation of register 1 or supplies outputs signal 9 of logic circuit 3 to the peripheral circuit as an input signal.

Figure 2:
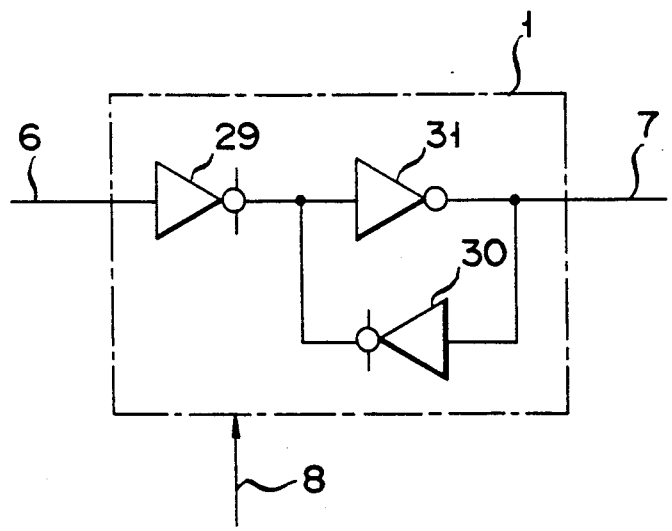
FIG. 2 is a circuit diagram showing an example of the structure of a register in the device shown in FIG. 1.

FIG. 2 shows an example of the structure of register 1 in the device shown in FIG. 1. Register 1 comprises two clocked inverters 29 and 30 controlled by clock signal 8 and inverter 31. Input signal 6 is supplied to an input and node of clocked inverter 29. An output node of clocked inverter 29 is connected to an input node of inverter 31 and an output node of clocked inverter 30. An output node of inverter 31 is connected to an input node of clocked inverter 30. Stored data 7 is output from the output node of inverter 31.

Figure 3:
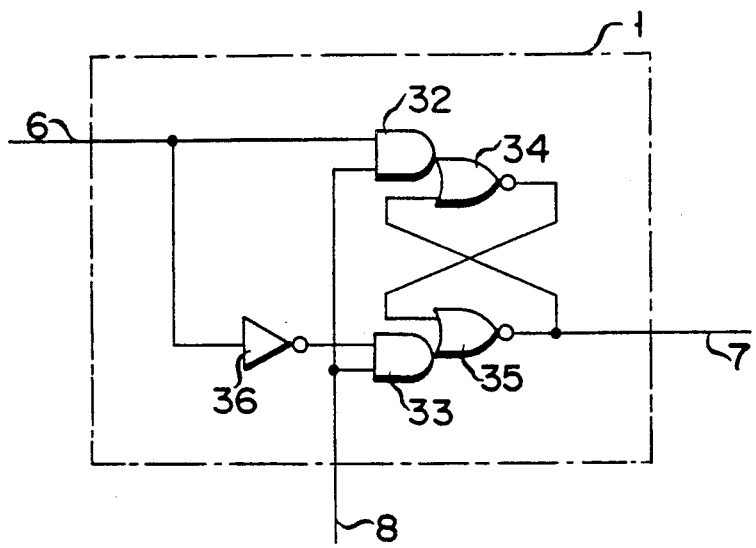
FIG. 3 is a circuit diagram showing another example of the structure of the register in the device shown in FIG. 1.

FIG. 3 shows another example of the structure of register 1 of the device shown in FIG. 1. Register 1 comprises two AND gates 32 and 33, two NOR gates 34 and 35, and inverter 36. Input signal 6 is supplied to one of input terminals of AND gate 32 and an input node of inverter 36. An output signal of inverter 36 is supplied to one of input terminals of AND gate 33. Clock signal 8 is supplied from AND gate 26 to the other input terminals of AND gates 32 and 33. An output signal of AND gate 32 is supplied to one of input terminals of NOR gate 34, and an output signal of AND gate 33 is supplied to one of input terminals of NOR gate 35. An output signal of NOR gate 35 is supplied to the other input terminal of NOR gate 34, and an output signal of NOR gate 34 is supplied to the other input terminal of NOR gate 35. Stored data 7 is output from an output terminal of NOR gate 35.

Figure 4:
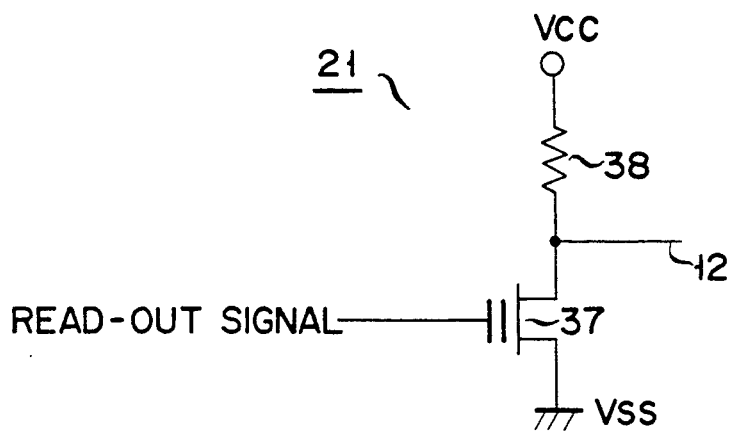
FIG. 4 is a circuit diagram showing an example of the structure of a flag circuit in the device shown in FIG. 1.

FIG. 4 illustrates an example of the structure of flag circuit 21 of the device shown in FIG. 1. Flag circuit 21 comprises EPROM cell 37 and load element 38. A current path of resistor 38 serving as the load element and EPROM cell 37 is connected in series between power source Vcc and ground Vss. A read-out signal is supplied to a control gate of EPROM cell 37. Signal 12 is output from a connecting node of resistor 38 and EPROM 37.

In flag circuit 21 illustrated in FIG. 4, when a floating gate of EPROM cell 37 is charged with electrons, cell 37 is not turned on even if a read-out signal is supplied. Output signal 12 of flag circuit 12 is thus set at an "H" (high) level. When the floating gate is not charged with electrons, a read-out signal is supplied and then cell 37 is turned on. Output signal 12 of flag circuit 12 is set at an "L" (low) level.

Figure 5:
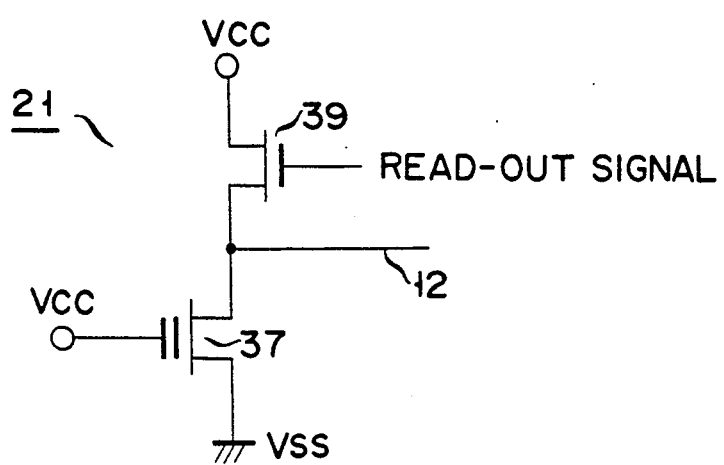
FIG. 5 is a circuit diagram showing another example of the structure of the flag circuit in the device shown in FIG. 1.

As shown in FIG. 5, MOS transistor 39 can be used as a load element in place of resistor 38, and the conducting state of transistor 39 can be controlled by a read-out signal. Power source voltage Vcc is applied to the control gate of EPROM cell 37. Flag circuit 21 is not limited to the structures shown in FIGS. 4 and 5 and it only has to be so constructed that the level of output signal 12 cna be switched to an "H" level or an "L" level.

An operation of the circuit shown in FIGS. 1 to 5 will be described. In the circuit shown in FIG. 1, if output signal 12 of glag circuit 21 is at an "H" level, data 7 stored in register 1 is selected by logic circuit 2 and output from output pad 28 as output signal 11. Since signal 12 is at the "H" level, logic circuit 3 transmits signal 10 input to input pad 22 to register 1 as output signal 8. In other words, input signal 10 is used as a clock signal of register 1. If an output signal of flag circuit 21 is at an "L" level, input signal 6 is selected by logic circuit 2 and output from pad 28 as output signal 11. Since signal 12 is at the "L" level, logic circuit 3 supplies input signal 10 to a peripheral circuit as an input signal.

As described above, two logic circuits 2 and 3 are controlled by one flag circuit 21 and therefore the selecting operation of first logic circuit 2 is associated with that of second logic circuit 3. When first logic circuit 2 selects and outputs data 7 stored in register 1, second logic circuit 3 supplies input signal 10 to register 1 as clock signal 8 and thus register 1 goes into an operating state. Consequently, any malfunction does not occur. When first logic circuit 2 selects and outputs input signal 6, second logic circuit 3 always outputs input signal 10 as input signal 9 of the peripheral circuit. Since register 1 is not supplied with a clock signal for control, it is not operated. Low power consumption can be achieved without wasting power consumption. Furthermore, since the number of flag circuits is one, the flag setting operation can be simplified and the area of a pattern can be decreased.

Figure 6:
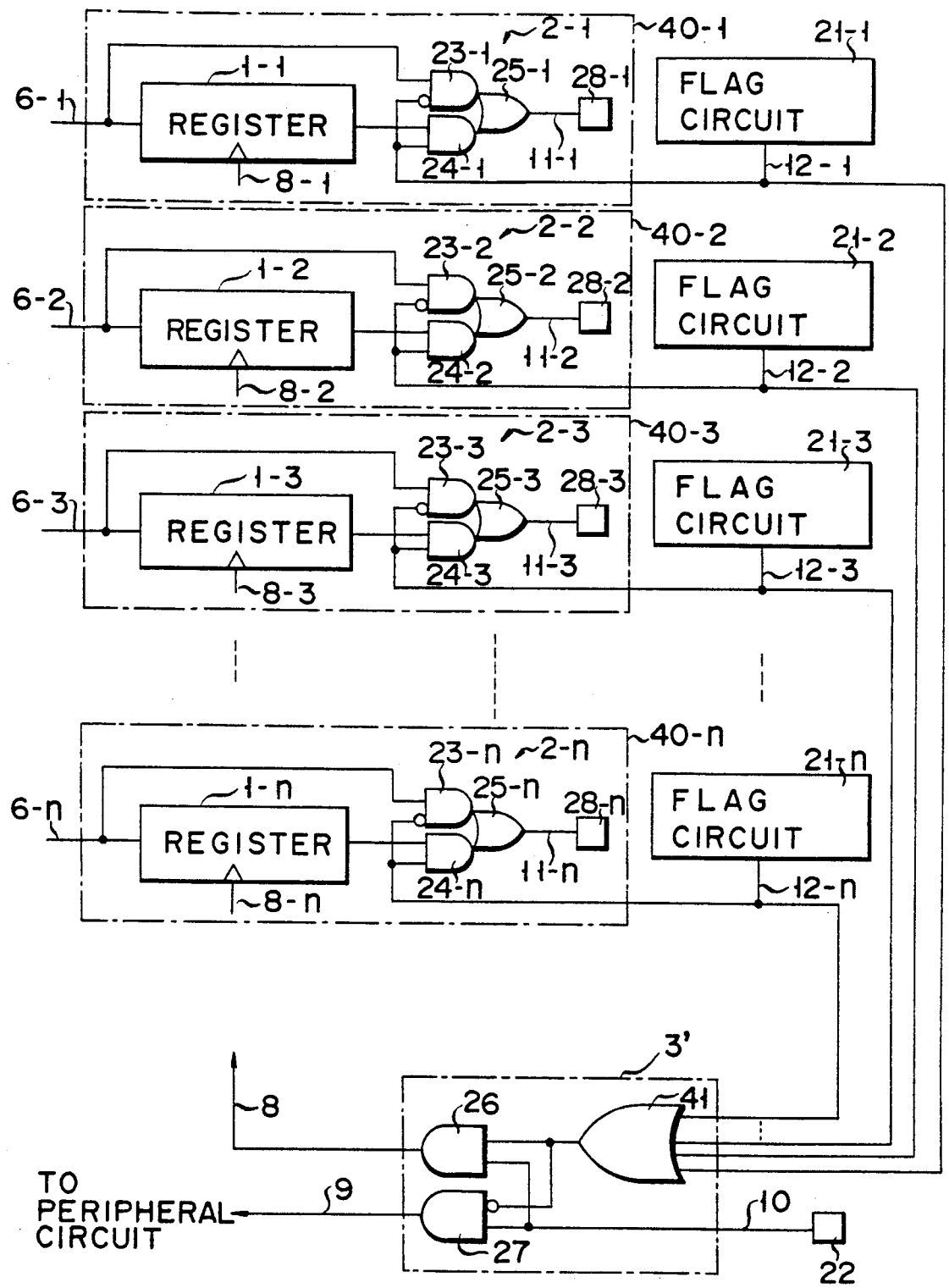
FIG. 6 is a block diagram showing an input switching device according to a second embodiment of the present invention.

FIG. 6 shows an input switching device according to a second embodiment of the present invention, which includes a plurality of the circuits (n circuits). The device shown in FIG. 6 comprises circuit blocks 40-1 to 40-n including register 1, logic circuit 2 and output pad 28 shown in FIG. 1. Circuit block 40-1 is controlled by flag circuit 21-1. Similarly, circuit blocks 40-2 to 40-n are controlled by flag circuits 21-2 to 21-n, respectively. Output signals 12-1 to 12-n of flag circuits 21-1 to 21-n are supplied to an input terminal of n input OR gate 41 arranged in logic circuit 3'. An output signal of OR gate 41 is supplied to one of input terminals of AND gate 26, and its inverted signal is supplied to one of input terminals of AND gate 27. Input signal 10 is supplied from input pad 22 to the other input terminals of AND gates 26 and 27. Output signal 8 of AND gate 26 is supplied to the clock input terminals of registers 1-1 to 1-n arranged in circuit blocks 40-1 to 40-n. Output signal 9 of AND gate 27 is supplied to an input terminal of a peripheral circuit (not shown).

With the above circuit arrangement, if at least one of outputs signals of flag circuits 21-1 to 21-n is at an "H" level, an output signal of OR gate 41 is set at an "H" level and input signal 10 is supplied as clock signal 8 to clock input terminals of registers 1-1 to 1-n. If all output signals of flag circuit 21-1 to 21-n are at an "L" level, input signal 10 is supplied to the peripheral circuit as input signal 9.

In this arrangement, logic circuit 3' allows and prevents the supply of a minimum essential clock signal in accordance with the selecting operations of logic circuits 2-1 to 2-n; accordingly, an input switching operation can be reliably and satisfactorily operated.

Figure 7:
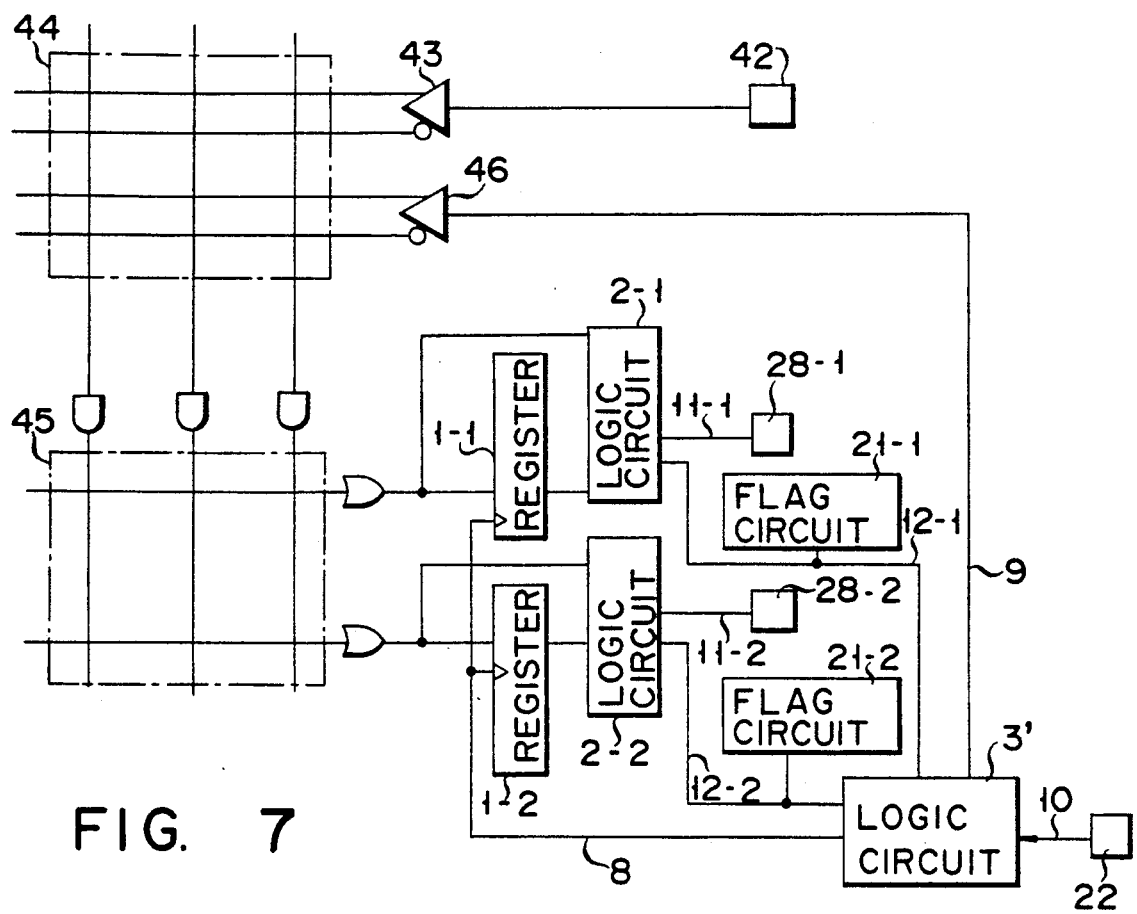
FIG. 7 is a block diagram for explaining an input switching device according to a third embodiment of the present invention.

FIG. 7 shows a circuit arrangement in which the circuit shown in FIG. 1 is applied to a system. An input signal supplied to IC input pad 42 is supplied to an input terminal of buffer circuit 43. Buffer circuit 43 comprises a main output terminal and an inversion output terminal. An output signal of buffer circuit 43 is supplied to first memory matrix 44. An output signal of memory matrix 44 is supplied to second memory matrix 45. An output signal of memory matrix 45 is supplied to data input terminals of registers 1-1 and 1-2 and to logic circuits 2-1 and 2-2. Data stored in register 1-1 is supplied to logic circuit 2-1, and data stored in register 1-2 is supplied to logic circuit 2-2. Output signal 11-1 of logic circuit 2-1 is output from output pad 28-1, and output signal 11-2 of logic circuit 2-2 is output from output pad 28-2. Input signal 10 supplied to input pad 22 is supplied to logic circuit 3'. Logic circuit 3' has basically the same arrangement as that of logic circuit 3' shown in FIG. 6 and its output signal 9 is supplied to buffer circuit 46. Buffer circuit 46 comprises a main output terminal and an inversion output terminal as buffer circuit 43 does, and its output signal is supplied to registers 1-1 and 1-2 and logic circuits 2-1 and 2-2 via first and second memory matrices 44 and 45. Output signal 8 of logic circuit 3' is supplied to registers 1-1 and 1-2 as a clock signal. Output signal 12-1 of flag circuit 21-1 is supplied to logic circuit 2-1 and logic circuit 3', and output signal 12-2 of flag circuit 21-2 is supplied to logic circuit 2-2 and logic circuit 3'. The selecting operations of logic circuits 2-1 and 3' are controlled by flag circuit 12-1, and those of logic circuits 2-2 and 3' are controlled by flag circuit 21-2.

An operation of the circuit having the above arrangement will be described. Upon receiving an input signal from input pad 42, the input signal is supplied to memory matrix 44 through buffer circuit 43. An output signal of memory matrix 44 is supplied to memory matrix 45. An output signal of memory matrix 45 is supplied to registers 1-1 and 1-2 and logic circuits 2-1 and 2-2. The selecting operations of logic circuits 2-1 and 2-2 are determined in accordance with the setting of the flags of flag circuits 21-1 and 21-2. When at least one of data stored in register 1-1 and data of stored in register 1-2 is selected by logic circuits 2-1 and 2-2, input signal 10 is supplied to registers 1-1 and 1-2 as clock signal 8. The data stored in registers 1-1 and 1-2 are output from output pads 28-1 and 28-2 as output signals 11-1 and 11-2, respectively. When an output signal of memory matrix 45 is selected by logic circuit 2-1 and 2-2, input signal 10 supplied to input pad 22 is supplied to buffer circuit 46 as input signal 9. An output signal of buffer circuit 46 is output from output pads 28-1 and 28-2 through logic circuits 2-1 and 2-2 as output signals 11-1 and 11-2.

Figure 8:
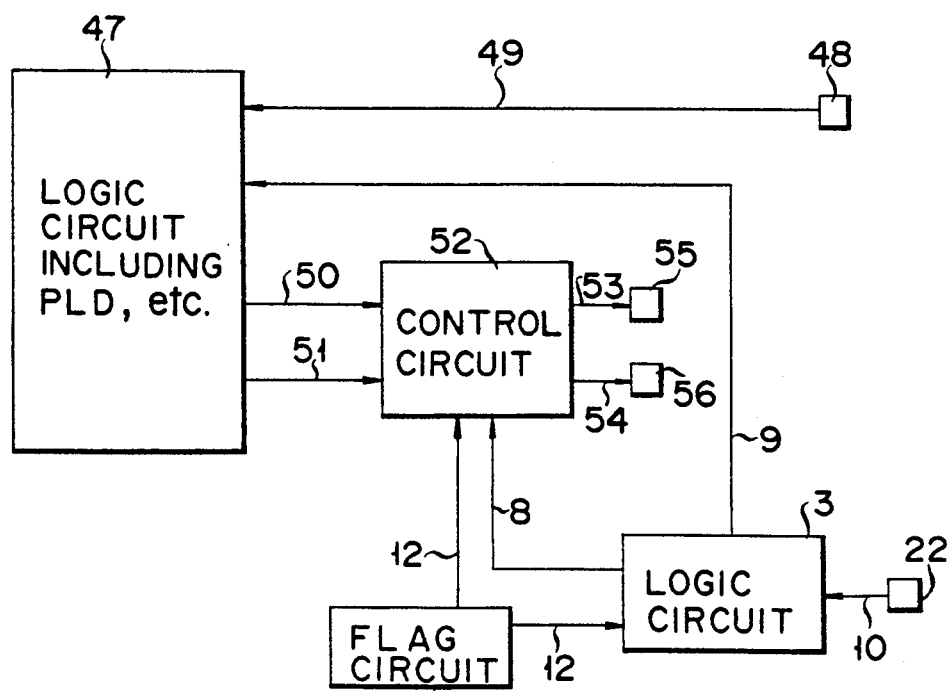
FIG. 8 is a block diagram for explaining an input switching device according to a fourth embodiment of the present invention.

FIG. 8 is a block diagram showing an example of the structure of a system in which the input switching device according to the present invention is used. Input signal 49 is supplied from input pad 48 to logic circuit 47 (corresponding to memory matrices 44 and 45 in the circuit shown in FIG. 7) including PLD and the like, and input signal 10 supplied to input pad 22 is supplied to logic circuit 47 through logic circuit 3. Output signals 50 and 51 of logic circuit 47 are supplied to control circuit 52 (corresponding to registers 1-1 and 1-2 and logic circuits 2-1 and 2-2 in the circuit shown in FIG. 7). Control circuit 52 is supplied with output signal 8 of logic circuit 3 as a clock signal. Logic circuit 3 and control circuit 52 are controlled by output signal 12 of flag circuit 21. Output signals 53 and 54 of control circuit 52 are output from output pads 55 and 56.

In the circuit shown in FIG. 8, upon receiving input signal 49, which is to be used as a normal input signal, from input pad 48, output signals 50 and 51 output from logic circuit 47 in accordance with internal logic of logic circuit 47. The selecting operation of control circuit 52 is determined in accordance with the setting of the flag of flag circuit 21. When output signals 50 and 51 of logic circuit 47 are selected by control circuit 52, logic circuit 3 causes input signal 10 to be supplied to control circuit 52 as clock signal 8. Consequently, output signals 50 and 51 are output from output pads 55 and 56 as output signals 53 and 54, respectively.

When signal 9 is selected by logic circuit 3 in accordance with the state of the flag of flag circuit 21, input signal 10 supplied to input pad 22 is supplied to logic circuit 47 as input signal 9. Output signals 50 and 51 are output in accordance with internal logic of logic circuit 47, and they are output from output pads 55 and 56 as output signals 53 and 54, respectively.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. An input switching device comprising:
   logic means for performing logical processing in response to a first input signal, said logic means being controlled by a control signal;
   first selector means for receiving the first input signal and an output signal of said logic means, and selecting and outputting one of the first input signal and the output signal;
   second selector means for selecting one of supplying a second input signal to said logic means as a control signal and supplying the second input signal to a peripheral circuit as an input signal; and
   control means for controlling selecting operations of said first and second selector means to supply the second input signal to said logic means as a control signal when said first selector means selects the output signal of said logic means and to supply the second input signal to the peripheral circuit as an input signal when said first selector means selects the first input signal.

2. The input switching device according to claim 1, wherein said logic means comprises a register, said control signal is a clock signal, and said register is controlled by the clock signal.

3. The input switching device according to claim 2, wherein said register comprises a first clocked inverter whose input node is supplied with said first input signal and whose operation is controlled by said clock signal, an inverter whose input node is connected to an output node of said first clocked inverter, and a second clocked inverter whose output node is connected to the input node of said inverter and whose input node is connected to an output node of said inverter and whose operation is controlled by said clock signal, and said register output a stored data from the output node of said inverter.

4. The input switching device according to claim 2, wherein said register comprises a first AND gate whose first input node is supplied with said first input signal and whose second input node is supplied with said clock signal, a second AND gate whose first input node is supplied to an inverted signal of said first input signal and whose second input node is supplied wtih said clock signal, a first NOR gate whose first input node is connected to an output node of said first AND gate, and a second NOR gate whose first input node is connected to an output node of said second AND gate, whose second NOR gate, and whose output node is connected to a second input node of said first NOR gate, and said register output a stored data from the output node of said second NOR gate.

5. The input switching device according to claim 1, further comprising second logic means for supplying the first input signal to said logic means.

6. The input switching device according to claim 5, wherein said second logic means comprises a memory matrix.

7. The input switching device according to claim 5, wherein said second logic means comprises a PLD.

8. The input switching device according to claim 1, wherein said first selector means comprises a first AND gate whose first input node is supplied with said first input signal and whose second input node is supplied with an inverted signal of an output signal of said control means, a second AND gate whose first input node is supplied with the output signal of said logic means and whose second input node is supplied with the output signal of said control means, and an OR gate whose first input node is connected to an output node of said first AND gate and whose second input node is connected to an output node of said second AND gate to supply a selecting output signal from an output node.

9. The input switching device according to claim 1, wherein said second selector means comprises a first AND gate whose first input node is supplied with said second input signal, whose second input node is supplied with an output signal of said control means, and whose output node supplies a control signal to said logic means, and a second AND gate whose first input node is supplied with said second input signal, whose second input node is supplied with an inverted signal of the output signal of said control means, and whose output node supplies an input signal of the peripheral circuit.

10. The input switching device according to claim 1, wherein said control means comprises a flag circuit.

11. The input switching device according to claim 10, wherein said flag circuit comprises a nonvolatile memory element, for determining a level of an output signal in accordance with data stored in the nonvolatile memory element.

12. The input switching device according to claim 1, wherein said second input signal is a signal supplied from an input pad.

13. The input switching device according to claim 1, wherein said device comprises a plurality of circuit blocks each of which includes said logic means, said first selector means and said control means, and said second selector means supplies said second input signal to the logic means of each of said circuit blocks as a control signal when said first selector means in each of said circuit block selects the output signal of said control means corresponding to said first selector means.

14. The input switching device according to claim 13, wherein said second selector means comprises an OR gate supplied with an output signal of said control means of said each circuit block, a first AND gate whose first input node is supplied with an output signal of said OR gate, whose second input node is supplied with said second input signal, and which supplies a control signal to said logic means of said each circuit block, and a second AND gate whose first input node is supplied with an inverted signal of the output signal of said OR gate, whose second input node is supplied with said second input signal, and which output node supplies an input signal of the peripheral circuit.

* * * * *